US009103025B2

United States Patent
Iyanagi et al.

(10) Patent No.: US 9,103,025 B2
(45) Date of Patent: Aug. 11, 2015

(54) MAGNETRON SPUTTERING APPARATUS AND METHOD OF MANUFACTURING SEMICONDUCTOR DEVICE

(75) Inventors: Katsumi Iyanagi, Yokohama (JP); Shigeki Matsunaka, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 2273 days.

(21) Appl. No.: 11/859,138

(22) Filed: Sep. 21, 2007

(65) Prior Publication Data
US 2008/0169186 A1 Jul. 17, 2008

(30) Foreign Application Priority Data

Sep. 22, 2006 (JP) ................................ 2006-257749
Sep. 4, 2007 (JP) ................................ 2007-228947

(51) Int. Cl.
| | |
|---|---|
| C23C 14/00 | (2006.01) |
| C25B 11/00 | (2006.01) |
| C25B 13/00 | (2006.01) |
| C23C 14/35 | (2006.01) |
| C23C 14/04 | (2006.01) |
| C23C 14/06 | (2006.01) |
| C23C 14/16 | (2006.01) |
| C23C 14/34 | (2006.01) |
| H01J 37/34 | (2006.01) |

(52) U.S. Cl.
CPC .............. *C23C 14/35* (2013.01); *C23C 14/046* (2013.01); *C23C 14/0641* (2013.01); *C23C 14/165* (2013.01); *C23C 14/345* (2013.01); *H01J 37/3408* (2013.01); *H01J 37/3455* (2013.01)

(58) Field of Classification Search
CPC .......................... H01J 37/3455; H01J 37/3408
See application file for complete search history.

(56) References Cited

U.S. PATENT DOCUMENTS

| | | | | |
|---|---|---|---|---|
| 4,995,958 A | * | 2/1991 | Anderson et al. | 204/298.2 |
| 2003/0102087 A1 | * | 6/2003 | Ito et al. | 156/345.46 |
| 2006/0231383 A1 | * | 10/2006 | Mullapudi et al. | 204/192.1 |

FOREIGN PATENT DOCUMENTS

| | | | | | |
|---|---|---|---|---|---|
| JP | 06240453 A | * | 8/1994 | | C23C 14/08 |
| JP | 2001-140070 | | 5/2001 | | |

OTHER PUBLICATIONS

Machine Translation of above JP 06240453 A.*
B. Window and N. Savvides, "Charged particle fluxes from planar magnetron sputtering sources", "J. Vac. Sci. Technolo. A4(2)" 1996, p. 196-202.
N. Savvides and B. Window, "Unbalanced magnetron ion-assisted deposition and property modification of thin films", "J. Vac. Sci. Technol. A4(3)" 1996, p. 504-508.

* cited by examiner

*Primary Examiner* — Keith Hendricks
*Assistant Examiner* — Ibrahime A Abraham
(74) *Attorney, Agent, or Firm* — Pearne & Gordon LLP (57) ABSTRACT

A magnetron sputtering apparatus includes a vacuum chamber, a target and a substrate holder disposed to face one another in the vacuum chamber, a magnetron disposed on the target side which is opposite to where the substrate holder is disposed, and a rotating mechanism for rotating the magnetron about an axis perpendicular to a face of the target. The magnetron includes an inner magnet formed of a sector-shaped frame and an outer magnet formed of a sector-shaped frame, these inner and outer magnets having a different polarity each other, the outer magnet being disposed to surround the inner magnet leaving a gap between the arcuate segments of the inner and outer magnets as well as a gap between straight segments of the inner and outer magnets, the width of these frames being substantially the same with each other.

6 Claims, 6 Drawing Sheets

MAGNETRON SPUTTERING APPARATUS AND METHOD OF MANUFACTURING SEMICONDUCTOR DEVICE

CROSS-REFERENCE TO RELATED APPLICATIONS

This application is based upon and claims the benefit of priority from prior Japanese Patent Applications No. 2006-257749, filed Sep. 22, 2006; and No. 2007-228947, filed Sep. 4, 2007, the entire contents of both of which are incorporated herein by reference.

BACKGROUND OF THE INVENTION

1. Field of the Invention

This invention relates to a magnetron sputtering apparatus and to a method of manufacturing a semiconductor device. In particular, this invention relates to a magnetron sputtering apparatus wherein the configuration of magnetron is desirably modified and to a method of manufacturing a semiconductor device, which includes a forming a diffusion barrier film by making use of this sputtering apparatus.

2. Description of the Related Art

The sputtering apparatus is generally constructed such that it comprises a vacuum chamber, a supply pipe connected with this vacuum chamber for feeding an inert gas such as argon, a vacuum pump connected, via an exhaust pipe, with the vacuum chamber, a combination of a substrate holder and a target which are disposed in the vacuum chamber so as to face one another, and a high-frequency power source for applying high-frequency to the substrate holder for example.

In the employment of this sputtering apparatus, a substrate is secured to the substrate holder at first and then gas is evacuated from the vacuum chamber through the actuation of a vacuum pump while feeding argon from the supply pipe to the vacuum chamber, thereby enabling the vacuum chamber to have a desired degree of vacuum. Thereafter, high-frequency is applied from the high-frequency power source to the substrate holder, thereby allowing plasma to generate between the substrate held by the substrate holder and the target. Due to the plasma thus generated, the argon is activated and caused to impinge against the target which is earthed or impressed with negative voltage, thereby sputtering the target material. The particles of target material thus sputtered are then caused to move toward the substrate and deposited on the surface of substrate, thus forming a film of target material.

This sputtering apparatus described above is accompanied with a problem that the coverage to be obtained is asymmetrical. This asymmetry may be attributed to the fact that since the neutral particles of target material (for example, metallic particles) are permitted to be sputtered preferentially from a central region of target, resulting in an increase in quantity of erosion especially at the central region of target, thereby causing the particles of target material to enter at an inclined angle into the outer peripheral portion of substrate and to deposit thereon.

With a view to minimize the asymmetry of coverage mentioned above, it has been practiced to dispose the magnetron in the vicinity of the outer periphery of the target material which is located opposite to the substrate holder, thereby increasing the quantity of erosion at the outer peripheral region of the target and hence decreasing the number of neutral metallic particles which would obliquely enter into the outer peripheral portion of substrate.

Furthermore, in the papers by B. Window and N. Savvides "J. Vac. Sci. Technol. A4(2)" 1996, p 196-202 and "J. Vac. Sci. Technol. A4(3)" 1996, p 504-508, these are disclosed measures to promote the electrolytic dissociation of neutral metallic particles to generate electrons and ions through the rotational motion of electrons along the lines of magnetic flux by making use of a divergent magnetic field, thereby attracting the electrons and ions thus generated to the substrate.

Further, JP-A 2001-140070 (KOKAI) discloses the employment of a magnetron of so-called asymmetric magnetic pole structure wherein a couple of elliptical ring-like or triangular ring-like magnets, each differing in polarity from the other, are concentrically arranged in addition to the employment of a magnetron wherein a couple of circular ring-like magnets, each differing in polarity from the other, are concentrically arranged. In this document, inner magnets are arranged to have smaller magnetic field/magnetic flux as compared with outer magnets so as to enable the magnetic field to enter into the substrate from the magnetron, thereby making it possible to create a high-density plasma region in the vicinity of the substrate.

However, this method of introducing a divergent magnetic field into the substrate by making use of asymmetric magnetic pole is accompanied with a problem that since electrons are permitted to enter into the substrate while these electrons are being entangled with the magnetic field, an electron current is generated, causing damage to the elements on the substrate.

Therefore, it is impossible, even with these arts, to concurrently overcome the problems of the suppression of aforementioned asymmetry of coverage at the sidewall and bottom of substrate and of the suppression of the aforementioned damage to the elements on the substrate.

In order to alleviate the aforementioned asymmetry, it is required to increase the quantity of sputtering from the outer peripheral portion of target and, at the same time, to enhance the degree of electrolytic dissociation of target material (for example, metal) that has been sputtered. However, according to the method of enhancing the degree of electrolytic dissociation of metal by making use of a divergent magnetic field, electrons are permitted to move along the divergent magnetic field at the time of initiating the film deposition. Because of this, the electron current is permitted to be introduced at high speed into the substrate at the time of generating plasma, thus causing damage to the elements on the substrate. For example, when a diffusion barrier film is to be formed by making use of the aforementioned magnetron sputtering apparatus subsequent to the formation of a via hole in an interlayer insulating film on the occasion of forming a via-fill for connecting an impurity diffusion layer such as source/drain regions formed on the surface of semiconductor substrate with interconnects formed on the surface of the interlayer insulating film, the asymmetry of the diffusion barrier film on the inner surface of the via hole can be alleviated. However, due to the local accumulation, through the diffusion layer, of a high-speed electron current at the gate insulating film on the occasion of depositing the film, breakdown of the withstand voltage is caused, thus badly affecting the reliability of the resultant semiconductor device.

BRIEF SUMMARY OF THE INVENTION

According to a first aspect of the present invention, there is provided a magnetron sputtering apparatus including: a vacuum chamber; a target and a substrate holder, which are disposed to face one another in the vacuum chamber; a magnetron disposed on the target side which is opposite to where the substrate holder is disposed; and a rotating mechanism designed to rotate the magnetron about an axis perpendicular to a face of the target;

wherein the magnetron comprises an inner magnet formed of a sector-shaped frame and an outer magnet formed of a sector-shaped frame, these inner and outer magnets having a different polarity each other, the outer magnet being disposed to surround the inner magnet leaving a gap between an arcuate segment of the inner magnet and an arcuate segment of the outer magnet as well as a gap between a straight segment of the inner magnet and a straight segment of the outer magnet, the width of these frames being substantially the same with each other and these magnets being adapted to be integrally rotated about a rotational center located at a midpoint between a base portion of the inner magnet and a base portion of the outer magnet; the gap between the arcuate segments is set to a minimum possible distance required for securing a horizontal magnetic field of not less than 500 gauss at the face of target disposed to face the substrate holder; and the gap between the straight segments is set to not less than the magnitude of the gap between the arcuate segments.

According to a second aspect of the present invention, there is provided a method of manufacturing a semiconductor device, method including: forming a semiconductor element on a surface of semiconductor substrate and a conductive portion electrically connected with the semiconductor element; depositing an insulating film on the surface of semiconductor substrate in a manner to cover the semiconductor element as well as the conductive portion; forming an opening in the insulating film in a manner to enable the opening to reach the conductive portion; securing the semiconductor substrate to a substrate holder disposed inside a chamber of the aforementioned magnetron sputtering apparatus in such a manner that the insulating film is directed to face a target containing a film-forming material; applying AC power to the substrate holder of the sputtering apparatus and electronegative potential of a DC voltage to the target and concurrently actuating the rotation of magnetron by means of a rotating mechanism to generate plasma between the semiconductor substrate and the target, thereby sputtering the target to deposit a film on an inner surface of the opening; and filling the opening having the film deposited thereon with a conductive substance to form a via fill electrically connected with the conductive portion.

According to a third aspect of the present invention, there is provided a method of manufacturing a semiconductor device, method including: forming a gate electrode on a surface of a semiconductor substrate with a gate insulating film being interposed therebetween; forming a source region and a drain region by impregnating the semiconductor substrate with impurities with the gate electrode being employed as a mask; depositing an interlayer insulating film on an entire surface of the semiconductor substrate including the gate electrode, the source region and the drain region; forming via holes in predetermined regions of the interlayer insulating film which are aligned respectively with the source region and the drain region; securing the semiconductor substrate to a substrate holder disposed inside a chamber of the aforementioned magnetron sputtering apparatus in such a manner that the interlayer insulating film is directed to face a target containing a diffusion barrier material; applying AC power to the substrate holder of the sputtering apparatus and electronegative potential of a DC voltage to the target and concurrently actuating the rotation of magnetron by means of a rotating mechanism to generate plasma between the semiconductor substrate and the target, thereby sputtering the target to form a diffusion barrier film on inner surface of each of via holes formed in the interlayer insulating film; and filling the via holes having the diffusion barrier film deposited thereon with a conductive substance to form via fills electrically connected with the source region and the drain region, respectively.

DETAILED DESCRIPTION OF THE INVENTION

Next, the magnetron sputtering apparatus according to one embodiment of the present invention will be explained in detail with reference to the drawings.

Figure 1:
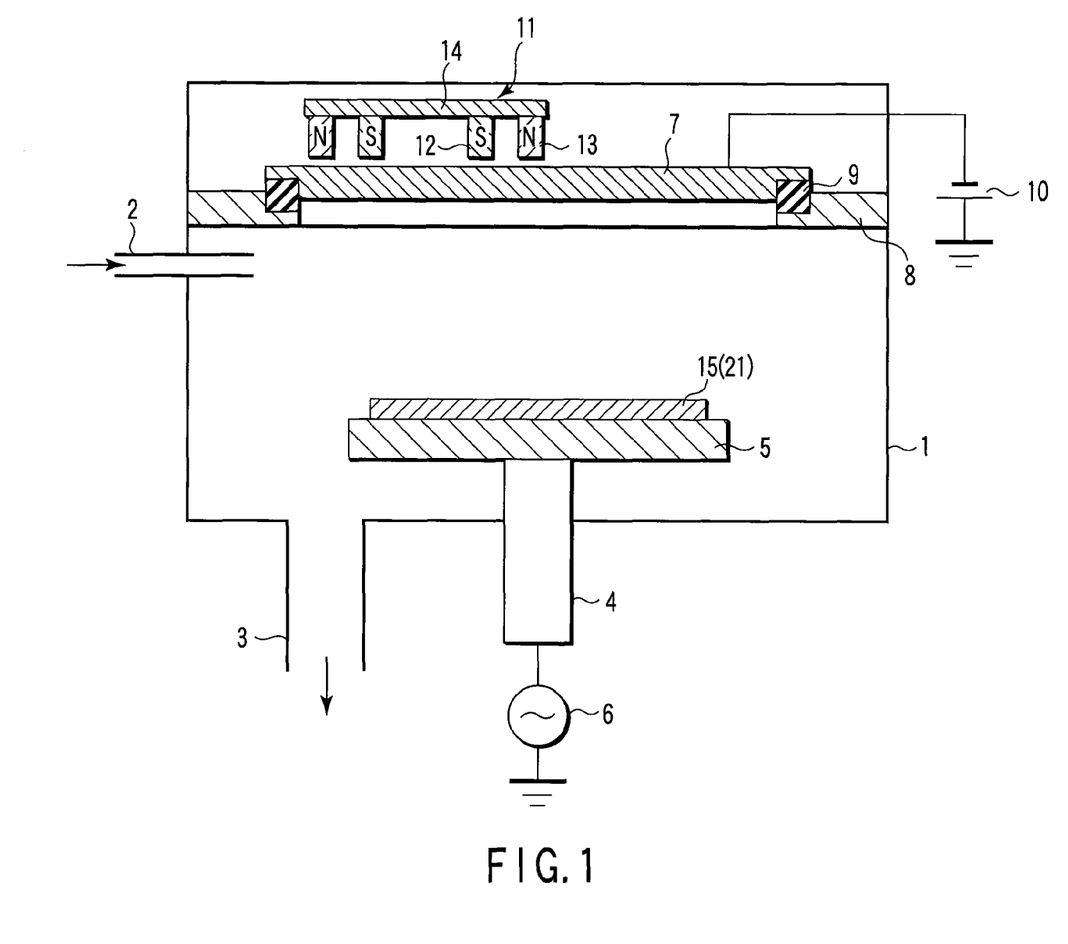
FIG. 1 is a cross-sectional view illustrating a magnetron sputtering apparatus according to an embodiment.
Figure 2:
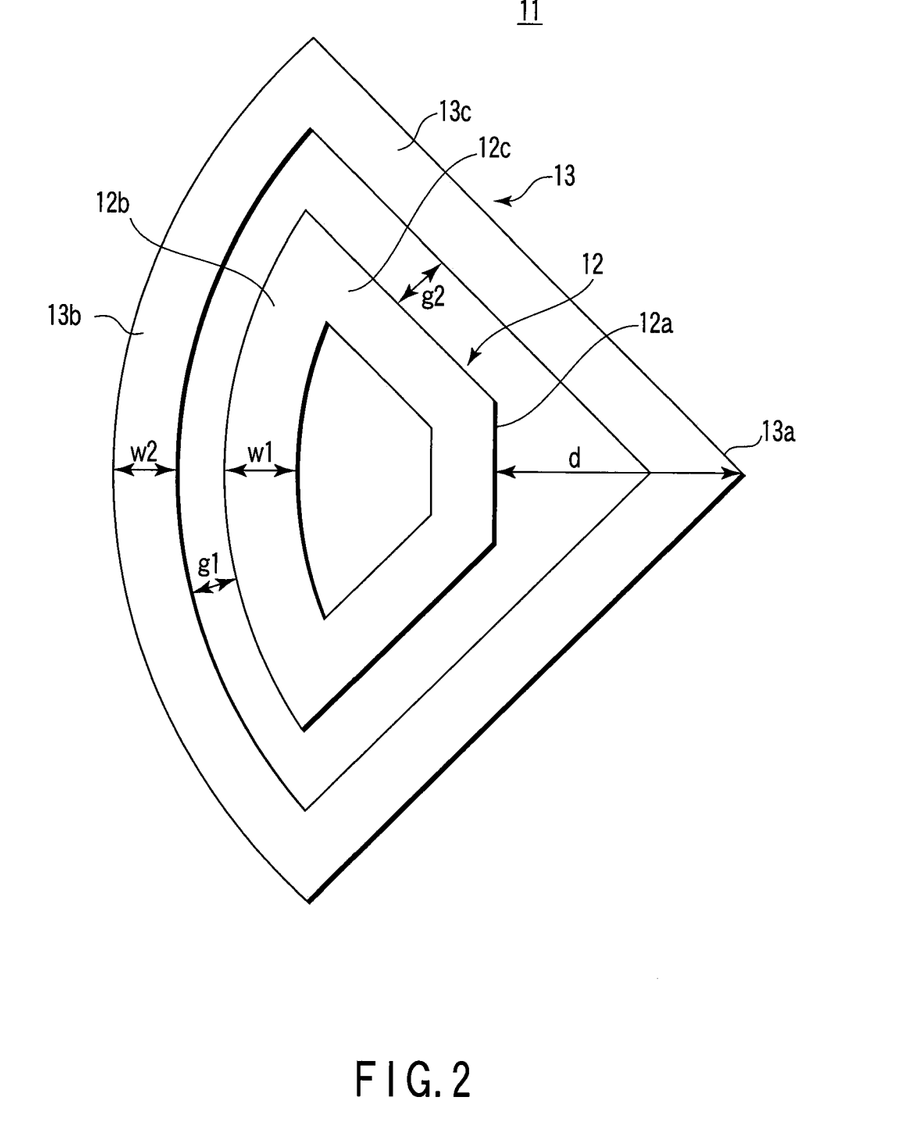
FIG. 2 is a plan view of a magnetron to be built in the sputtering apparatus of FIG. 1.

FIG. 1 is a cross-sectional view illustrating a magnetron sputtering apparatus according to one embodiment. FIG. 2 is a plan view of a magnetron to be built in the sputtering apparatus of FIG. 1.

A cylindrical vacuum chamber 1 having a closed bottom is connected with a gas feeding pipe 2 and also with one end of an exhaust pipe 3. The other end of the exhaust pipe 3 is connected with an evacuating means such as a vacuum pump. The vacuum chamber 1 is provided therein with a disc-like substrate holder 5 for sustaining a substrate which is rotatably supported by a rotary shaft 4. An AC power source 6 is electrically connected with the substrate holder 5, thereby making it possible, through the application of electric power, to attract ions toward the substrate holder 5. A target 7 is disposed to face the substrate holder 5 and fixed, through an insulating ring 9, to an annular supporting plate 8 disposed inside the vacuum chamber 1. A DC power source 10 (minus side) is electrically connected with the target 7.

A magnetron 11 is disposed on the rear side of target 7 (on one side of the target 7 which is opposite to the other side thereof facing the substrate holder) housed inside the vacuum chamber 1 and made rotatable about a rotary shaft (not shown) which is disposed substantially perpendicular to the face of target 7. As shown in FIG. 2, this magnetron 11 is secured to a yoke 14 and configured such that it comprises an inner magnet 12 formed of a sector-shaped frame and an outer magnet 13 formed of a sector-shaped frame and disposed to surround the inner magnet 12, these inner and outer magnets 12 and 13 having a different polarity each other. The sector-shaped frame of the inner magnet 12 is constituted two straight segments 12c radially extended from a base portion 12a and an arcuate segment 12b connected free ends of the two straight segments 12c. The sector-shaped frame of the outer magnet 13 is constituted two straight segments 13c radially extended from a base portion 13a and an arcuate segment 13b connected free ends of the two straight segments 13c. Preferably, the angle of the sector-shaped frame any of these inner and outer magnets 12 and 13 is confined to the range of 45 to 120°. The frames of these magnets 12 and 13 are designed to have the same width (w1, w2). The rotational center of the magnetron 11 is located at a midpoint within a distance (d) between the base portion 12a of the inner magnet 12 and the base portion 13a of the outer magnet 13.

In the rotation of the magnetron 11, the arcuate portion 13b of the outer magnet 13 should preferably be moved along the outer periphery of the target 7. Namely, the rotational center of the magnetron 11 comprising these inner and outer magnets 12 and 13 should preferably be set to agree with the center of the disc-like target 7.

Preferably, the inner magnet 12 forms a south pole and the outer magnet 13 forms a north pole. These inner and outer magnets 12 and 13 are respectively formed of an assembled structure comprising a plurality of columnar pieces (or prismatic magnet pieces) which are arranged side by side.

A gap (g1) to be created between the arcuate segment 12b of the inner magnet 12 and the arcuate segment 13b of the outer magnet 13 is set to a minimum possible distance required for securing a horizontal magnetic field of not less than 500 gauss at the face of target 7 disposed to face the substrate holder 5. A gap (g2) to be created between the straight segment 12c of the inner magnet 12 and the straight segment 13c of the outer magnet 13 is set to not less than the magnitude of the gap (g1) between the arcuate segments 12b and 13b. Especially, it is preferable that the gap (g2) between the straight segments 12c and 13c of these magnets is set to such a distance that is sufficient enough to secure at least 80% of a horizontal magnetic field of 500 gauss which is designed to be generated at the face of target due to the gap (g1) between the arcuate segments 12b and 13b.

Next, the operation of the magnetron sputtering apparatus described above will be explained.

A substrate 15 such as a semiconductor wafer having elements formed therein is installed in the substrate holder 5. While introducing, for example, argon gas into the vacuum chamber 1 through the gas feeding pipe 2, an evacuating means such as a vacuum pump is actuated to discharge the gas from the vacuum chamber 1 via the exhaust pipe 3. After the degree of vacuum inside the vacuum chamber has been stabilized, AC power is applied from the AC power source 6 to the substrate holder 5 via the rotary shaft 4 and at the same time, an electronegative potential is applied from the DC power source 10 to the target 7. Simultaneously, the magnetron 11 disposed on the rear side of target 7 is rotated.

At this moment, plasma is caused to generate at a region between the substrate 15 mounted on the substrate holder 5 and the target 7 both disposed inside the vacuum chamber 1. Due to the generation of this plasma, the argon is activated and this activated argon is caused to impinge against the target 7 that has been impressed with a minus voltage to thereby sputter the target material. The particles of sputtering material thus sputtered are caused to move to the substrate 15 and then deposited on the surface of substrate 15, thus forming a film of target material.

In the case of this sputtering apparatus, the magnetron 11 constituted by the inner magnet 12 acting as the south pole and by the outer magnet 13 acting as the north pole and being disposed to surround the inner magnet 12, both magnets 12, 13 being secured to the yoke 14 as shown in FIG. 2, is designed to be actuated on the rear side of the target 7 and rotated about a midpoint within a distance (d) between a base portion 12a of the inner magnet 12 and a base portion 13a of the outer magnet 13. As a result, due to this rotation of magnetron 11, it is possible to effectively sputter the outer peripheral portion of target 7 by making use of the gap (g1) created between an arcuate segment 12b of the inner magnet 12 and an arcuate segment 13b of the outer magnet 13. Namely, since the gap (g1) is set to a minimum possible distance required for securing a horizontal magnetic field of not less than 500 gauss at the face of target 7 disposed to face the substrate holder 5 to thereby non-uniformly arrange the inter-magnetic distance, it is possible to enhance the electron-entrapping efficiency at the target 7 facing the gap (g1) and to increase the plasma density. As a result, the ratio in quantity of sputtering at the outer peripheral portion of target 7 to the quantity of sputtering at the central portion of target 7 (ratio in quantity of sputtering:outer peripheral portion/central portion) can be increased as compared with the case where the conventional magnetron sputtering apparatus provided with an elliptical ring-like magnet or a triangular ring-like magnet is employed. Because of this, it is now possible to improve the asymmetry of coverage.

If the electrolytic dissociation of target component (for example, neutral metallic particles) that has been sputtered is promoted by making use of divergent magnetic field which is directed to a substrate as in the case of related art, the electrons generated by the effects of plasma in the vicinity of target will be transported along the divergent magnetic field. As a result, an electric current of high velocity is permitted to locally enter into the substrate on the occasion of generating plasma, thus causing damage to the elements formed on the substrate.

Whereas, in the case of the magnetron 11 according to this embodiment, since the magnetron 11 is provided with the inner magnet 12 having a straight segment 12c and with outer magnet 13 having a straight segment 13c and, at the same time, the gap (g2) created between the straight segment 12c and the straight segment 13c is set to a distance which is larger than that of the gap (g1) between the arcuate segments 12b and 13b, it is possible to suppress the generation of divergent magnetic field as compared with the magnets of the conventional type. Therefore, it is possible to suppress the intensity of divergent magnetic field to be introduced into the substrate to not higher than 10 gauss for instance. As a result, it is now possible to effectively prevent the elements formed on the substrate from being damaged.

Moreover, the magnetron 11 is designed to have a rotational center which is located at a midpoint within a distance (d) between a base portion 12a of the inner magnet 12 and a base portion 13a of the outer magnet 13 and designed to be revolved about a rotational axis which is located in the vicinity of the center of target 7. As a result, the region of erosion can be made uniform all over the surface of target 7, thus increasing the lifetime of the target 7.

Therefore, it is possible, according to this embodiment, to provide a magnetron sputtering apparatus which is capable of suppressing the asymmetry of coverage to the same extent as in the case where a divergent magnetic field is employed by way of asymmetric magnetic field and which is also capable of obviating damage to the elements formed on the substrate, thus making it possible to form a film excellent in coverage on the substrate while securing the reliability of the elements formed on the substrate.

Next, the method of manufacturing a semiconductor device according to another embodiment of the present invention will be explained in detail with reference to FIGS. 3A to 3E.

Figure 3A:
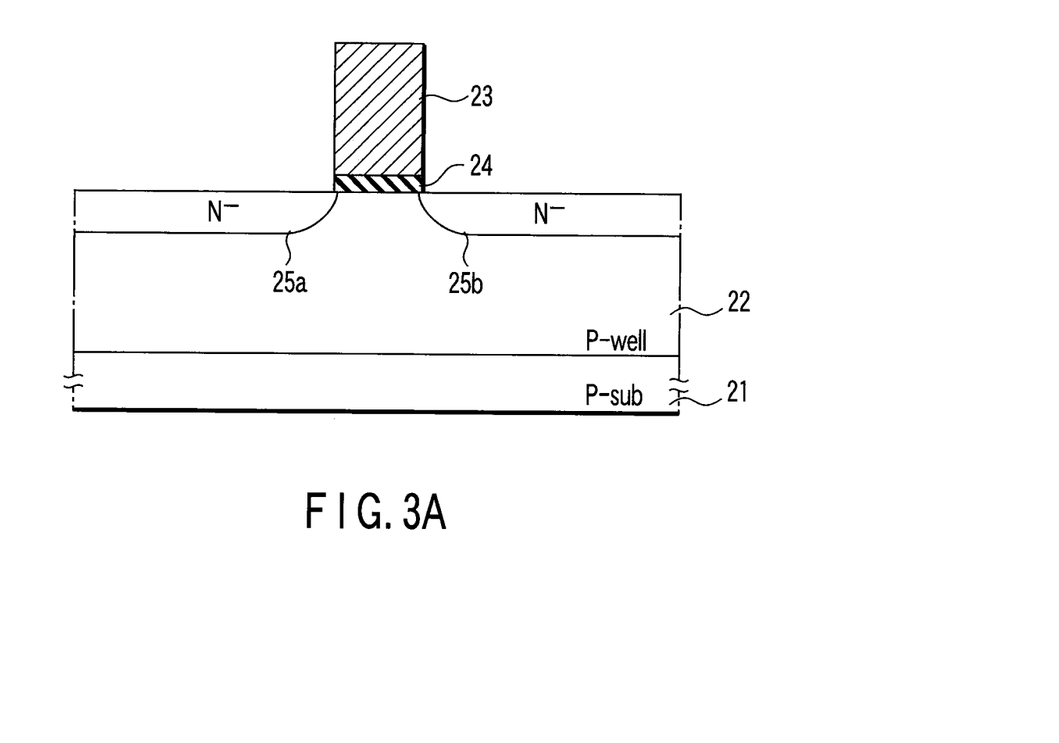
FIGS. 3A, 3B, 3C, 3D and 3E are cross-sectional views each illustrating the manufacturing a semiconductor device according to another embodiment.
Figure 3B:
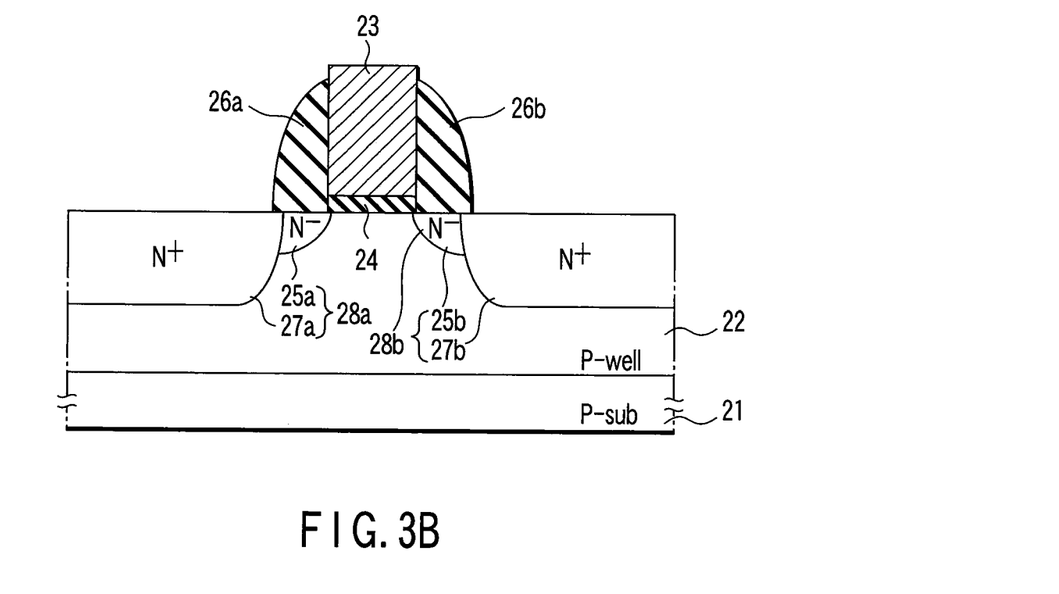

First of all, as shown in FIG. 3A, a P-type impurity (boron for example) is diffused into a P-type silicon substrate 21 by making use of diffusion technique such as ion implantation to thereby form a P-well 22. Subsequently, a silicon oxide film and an impurity-doped polycrystalline silicon film are successively formed on the surface of the P-well 22. Then, the impurity-doped polycrystalline silicon film is subjected to patterning to form a gate electrode 23. Thereafter, the underlying silicon oxide film is selectively etched and removed with the gate electrode 23 being used as a mask to form a gate insulating film 24. Subsequently, an N-type impurity (arsenic for example) is ion-implanted in the P-well 22 with the gate electrode 23 being used as a mask to form N⁻ diffusion layers 25a and 25b each having a low impurity concentration and a small junction depth.

Then, a silicon nitride film having almost the same thickness as that of the gate electrode 23 is deposited all over the surface and then subjected to anisotropic etching (for example, reactive ion etching: RIE) to form silicon nitride sidewalls 26a and 26b on the longitudinally extending opposite sidewalls of the gate insulating film 24 and of the gate electrode 23. Thereafter, with the gate electrode 23 and the silicon nitride sidewalls 26a and 26b being used as a mask, an N-type impurity (phosphorus for example) is ion-implanted in the N⁻ diffusion layers 25a and 25 to form N⁺ diffusion layers 27a and 27b each having a high impurity concentration and a great junction depth. As a result, a source region 28 and a drain region 29 both having an LDD structure composed of the N⁻ diffusion layers 25a and 25b located in the vicinity of the channel region and the N⁺ diffusion layers 27a and 27b located away by a predetermined distance from the channel region are formed (see FIG. 3B).

Figure 3C:
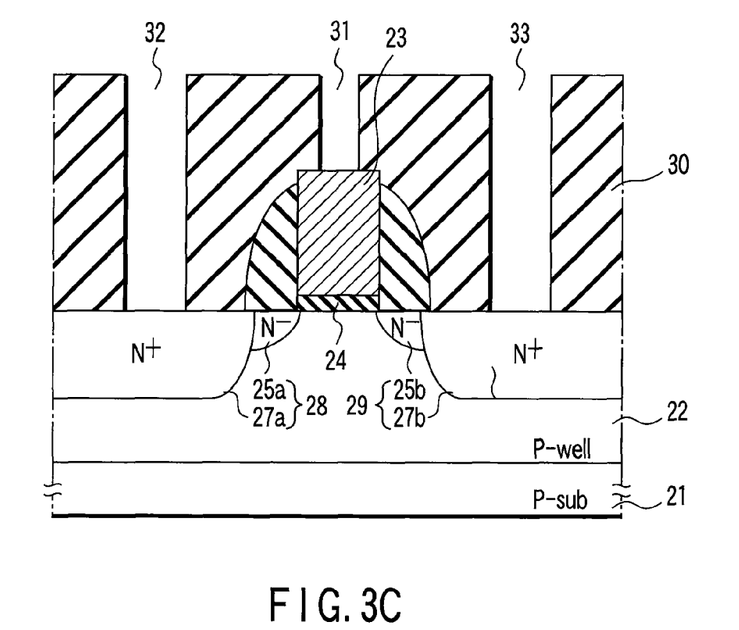

Then, as shown in FIG. 3C, by means of CVD method, an interlayer insulating film 30 made of $SiO_2$ is deposited all over the surface including the gate electrode 23. Thereafter, with a resist pattern (not shown) being employed as a mask, the interlayer insulating film 30 is selectively removed by means of RIE to open via holes 31 to 33 in the interlayer insulating film 30 so as to make these via holes correspond with the gate electrode 23, the source region 28 and the drain region 29, respectively.

Figure 3D:
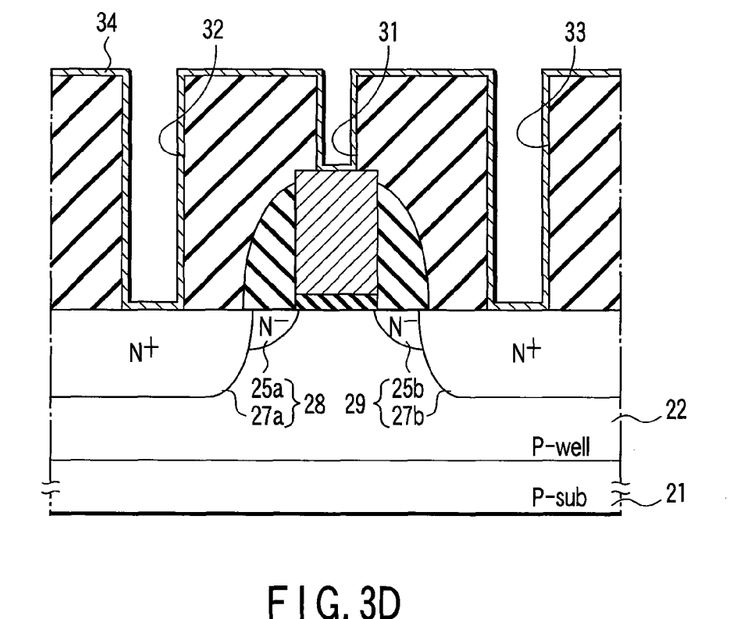

Then, the resist pattern on the surface of the interlayer insulating film 30 is peeled off by means of ashing, etc. Subsequently, the substrate 21 having the interlayer insulating film 30 with opened via holes 31-33 is secured to the substrate holder 5 disposed inside the chamber 1 of the aforementioned magnetron sputtering apparatus shown in FIGS. 1 and 2. On this occasion, a diffusion barrier material is employed as the target 7 of the sputtering apparatus. This diffusion barrier material may be selected, for example, from titanium, titanium nitride, tantalum, tantalum nitride and tungsten nitride. Then, while keeping the introduction of argon gas into the vacuum chamber 1 via the gas feeding pipe 2, an evacuating means such as a vacuum pump is actuated to discharge the gas from the vacuum chamber 1 through the exhaust pipe 3. After the degree of vacuum inside the vacuum chamber 1 has been stabilized, AC power is applied from the AC power source 6 to the substrate holder 5 via the rotary shaft 4 and at the same time, an electronegative potential is applied from the DC power source 10 to the target 7. Simultaneously, the magnetron 11 disposed on the rear side of target 7 is rotated. At this moment, plasma is caused to generate at a region between the silicon substrate 21 mounted on the substrate holder 5 and the target 7 both disposed inside the vacuum chamber 1. Due to the generation of this plasma, the argon is activated and this activated argon is caused to impinge against the target 7 that has been impressed with a minus voltage to thereby sputter the target material. The particles of sputtering material (diffusion barrier material) thus sputtered are caused to move to the interlayer insulating film 30 of silicon substrate 21 and then deposited, thereby forming a diffusion barrier film 34 on the surface of the interlayer insulating film 30 and the inner surface of each of via holes 31 to 33 formed in the interlayer insulating film 30 as shown in FIG. 3D.

Figure 3E:
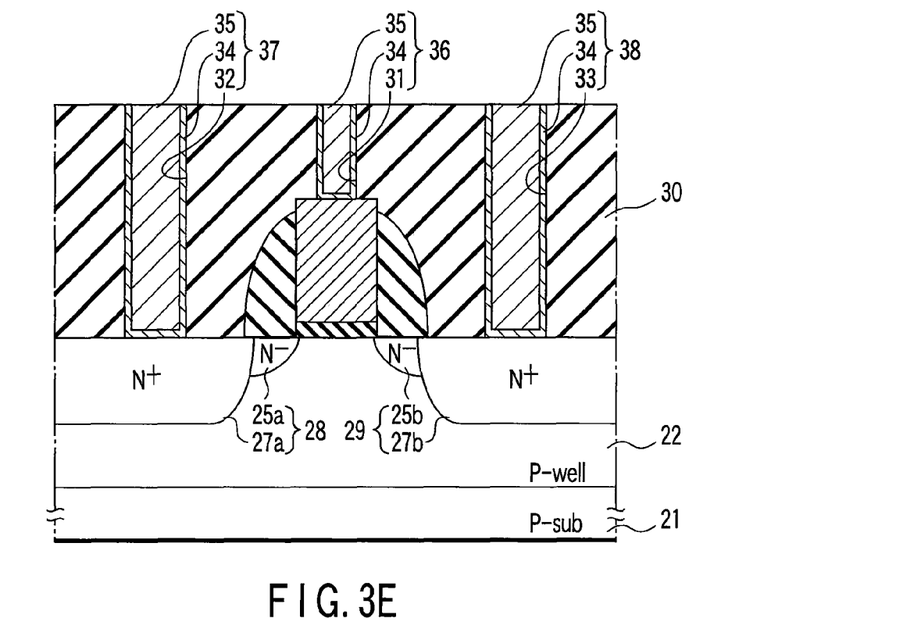

Subsequently, the silicon substrate 21 is taken out of the chamber of the magnetron sputtering apparatus and then a conductive film is deposited all over the surface of interlayer insulating film 30 including via holes 31 to 33 where the diffusion barrier film 34 is deposited. This conductive film may be deposited by making use of a tungsten film, a copper film, a copper alloy film, etc. for example. Then, as shown in FIG. 3E, this conductive film is subjected to a CMP treatment to obtain via holes 31-33 each filled with a conductive substance 35. Further, the diffusion barrier film 34 formed on the surface of interlayer insulating film 30 is removed to form via fills 36 to 38 constituted by via holes 31 to 33, by the diffusion barrier film 34 deposited on the inner surface of each of via holes 31 to 33, and by the conductive substance 35 filled in via holes 31 to 33, the resultant via fills 36 to 38 being electrically connected with the gate electrode 23, the source region 28 and the drain region 29, respectively. Thereafter, although not shown in the drawings, interconnects are formed on the surface of interlayer insulating film 30 by means of the ordinary method so as to electrically connect these interconnects with the via fills 36 to 38, respectively. The resultant silicon substrate 21 is further subjected to any necessary processes to manufacture a semiconductor device.

According to this embodiment, it is possible to form the diffusion barrier film 34 which is alleviated in asymmetry on the inner surface of each of via holes 31 to 33 by making use of the sputtering apparatus mounted with a magnetron of specific configuration as shown in FIGS. 1 and 2 on the occasion of forming the diffusion barrier film 34 by means of sputtering on the inner surface of each of via holes 31 to 33 formed in the interlayer insulating film 30. Concurrently, the generation of divergent magnetic field may be suppressed on the occasion of depositing the film, thereby enabling to suppress the intensity of divergent magnetic field to be introduced into the silicon substrate 21 to not more than 10 gauss for instance. As a result, the local accumulation of electrons from via holes 32 and 33 onto a region of the gate insulating film 24 which is located close to the exposed source region 28 or to the exposed drain region 29 can be minimized, thus making it possible to prevent breakdown of the withstand voltage.

Figure 4:
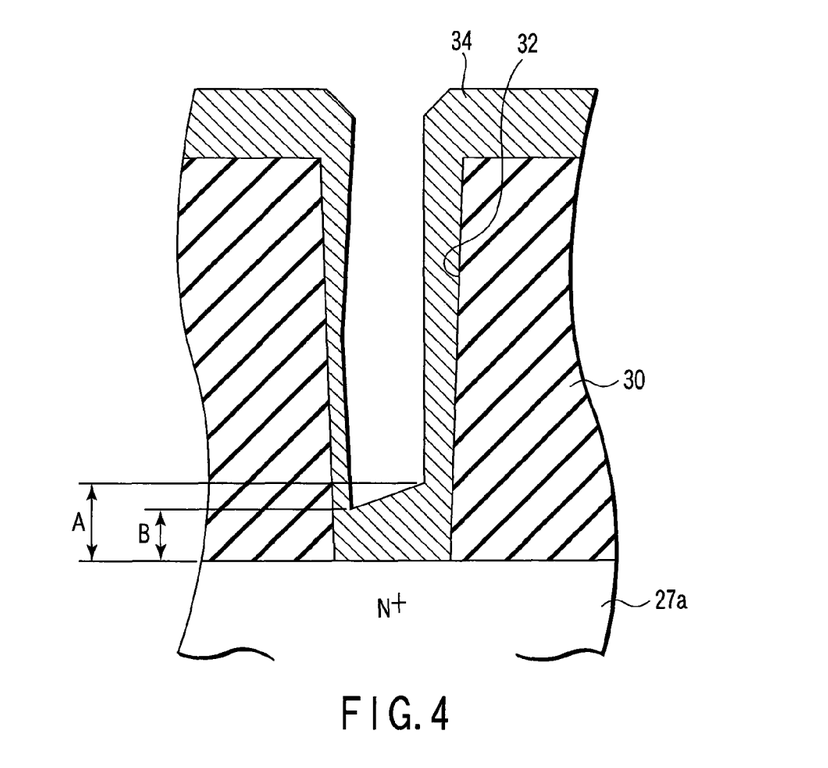
FIG. 4 is a cross-sectional view illustrating the features of a diffusion barrier film formed of Ti which is deposited on the inner surface of a via hole.

Actually, a via hole 32 having a diameter of 0.2 μm and a depth of 1 μm was formed in a portion of the interlayer insulating film 30 which was in alignment with the N-diffusion layer 27a of the source region and then, by making use of a sputtering apparatus comprising a magnetron of specific configuration as shown in FIGS. 1 and 2, a target comprising Ti was subjected to sputtering to form a diffusion barrier film 34 made of Ti on the inner surface of via hole 32, the resultant features being illustrated in FIG. 4. In this case, the ratio between the thickness at "A" of the diffusion barrier 34 and the thickness at "B" of the diffusion barrier 34 on the bottom of via hole 32 was about 1.19. Whereas, the ratio in thickness between these portions of diffusion barrier 34 as measured under the same conditions except that the conventional magnetron sputtering apparatus employing an elliptical ring-like magnet was used was about 1.43. From these experiments, it was confirmed that it was possible, with the employment of the magnetron sputtering apparatus shown in FIGS. 1 and 2, to alleviate the asymmetry of diffusion barrier and to form a diffusion barrier film having relatively uniform thickness on the inner surface of the via hole.

Further, when a plurality of gate insulting films of the semiconductor device that had been obtained according to the aforementioned method of the present invention were subjected to a withstand voltage test, breakdown of the withstand voltage of these gate insulting films was not recognized at all.

Whereas, in the case of the semiconductor device wherein the depositing a diffusion barrier film onto the inner surface of the via hole was executed by making use of the conventional magnetron sputtering apparatus employing an elliptical ring-like magnet, breakdown of the withstand voltage of the gate insulting film was admitted at a ratio of about 37%.

Figure 5:
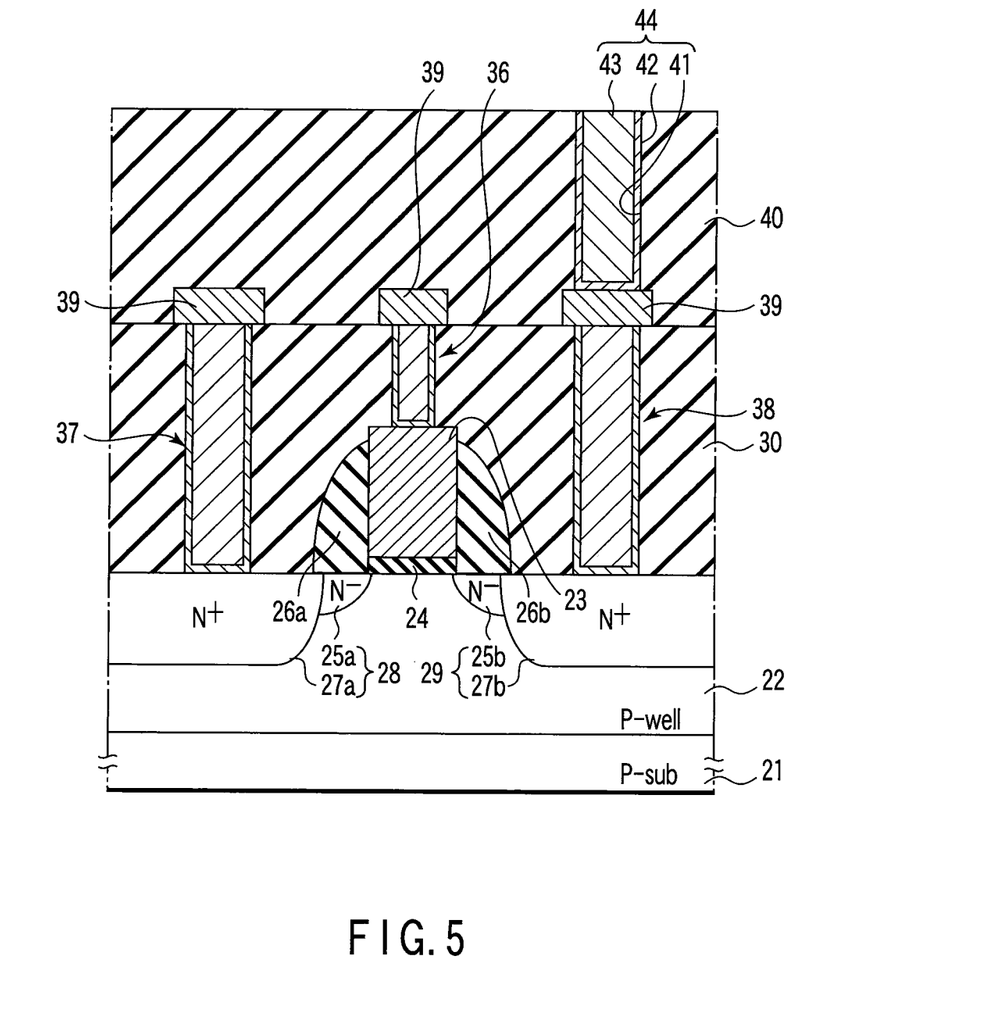
FIG. 5 is a cross-sectional view for illustrating the method of manufacturing a semiconductor device according to another embodiment.

In the embodiment of the present invention described above, a semiconductor device is manufactured through processes including a forming interconnects on the surface of interlayer insulating film 30 so as to connect them with each of via fills 36-38 as described above. This embodiment can be applied to the case where a second interconnect layer is further formed, through an interlayer insulating film, on the first-mentioned interconnect layer (a first interconnect layer). For example, as shown in FIG. 5, an interconnect layer (a first interconnect layer) 39 is formed on the interlayer insulating film 30 so as to electrically connect the interconnect layer with each of via fills 36 to 38, then an interlayer insulating film (a second interconnect layer) 40 is formed on the interlayer insulating film 30 including the first interconnect layer 39, and a via hole 41 is formed at a predetermined region of the interlayer insulating film 40. Thereafter, in the same manner as described above, by making use of the magnetron sputtering apparatus, a diffusion barrier film 42 is formed on the inner surface of via hole 41. Subsequently, via hole 41 having the diffusion barrier film 42 formed thereon is filled with a conductive substance 43 to form a via fill 44. In this embodiment, a sequence of manufacturing steps including a forming a second interconnect layer so as to electrically connect it with this via fill can be subsequently executed to manufacture a semiconductor device.

In this case, it is possible to suppress the semiconductor elements formed on the substrate from being badly affected. More specifically, it is possible to prevent breakdown of the withstand voltage of the gate insulating film of a transistor for instance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetron sputtering apparatus comprising:
a vacuum chamber;
a target and a substrate holder, which are disposed to face one another in the vacuum chamber;
a magnetron disposed on the target side which is opposite to where the substrate holder is disposed; and
a rotating mechanism designed to rotate the magnetron about an axis perpendicular to a face of the target;
wherein the magnetron comprises an outer frame magnet and an inner frame magnet provided in the outer frame magnet,
the outer frame magnet comprises: a first straight frame segment; a second straight frame segment which has an end continuous with an end of the first straight frame segment, and which has the same length as the first straight frame segment; and a third arcuate frame segment which has ends respectively continuous with other ends of the first and second straight frame segments, the first straight frame being located at an angle of 45 to 120 degrees to the second straight frame,
the inner frame magnet comprises: a first straight frame segment which is located parallel to the first straight frame segment of the outer frame magnet a second straight frame segment which is located parallel to the second straight frame segment of the outer frame magnet, and which has the same length as the first straight frame segment of the inner frame magnet a third arcuate frame segment having ends which are continuous with ends of the first and second straight frame segments of the inner frame magnet and a fourth straight frame segment having ends continuous with other ends of the first and second straight frame segments of the inner frame magnet,
the first and second straight frame segments and third arcuate frame segment of the outer frame magnet and the first, second, and fourth straight frame segments and third arcuate frame segment of the inner frame magnet have the same width,
the outer and inner frame magnets are adapted to be rotated along with each about a rotational center which is located at a position in which the first and second straight frame segments of the outer frame magnet are continuous with each other, or which is located between the position and the fourth straight frame segment,
a first gap between the third arcuate frame segments of the outer and inner frame magnets is set to a minimum possible distance required for securing a horizontal magnetic field of not less than 500 gauss at the face of target disposed to face the substrate holder, and
second gaps between the first straight frame segments and between the second straight frame segments of the outer and inner frame magnets are set to not less than the magnitude of the first gap.

2. The apparatus according to claim 1, wherein the inner frame magnet is a south pole and the outer frame magnet is a north pole.

3. The apparatus according to claim 1, wherein the inner frame magnet and the outer frame magnet are respectively formed of an assembled structure comprising a plurality of columnar or prismatic magnet pieces which are arranged side by side.

4. The apparatus according to claim 1, wherein each of the second gaps is set to such that it is sufficient enough to secure at least 80% of a horizontal magnetic field of 500 gauss which is designed to be generated at the face of target due to the first gap.

5. The apparatus according to claim 1, wherein the outer frame magnet is arranged such that the outer periphery of the third arcuate frame segment thereof is located to the outer circumference of the target.

6. The apparatus according to claim 1, wherein the magnetron is arranged on the target side opposite to the substrate holder such that the rotational center thereof center as well as the center of the target is located at a position in which the first and second straight frame segments of the outer frame magnet are continuous with each other, or between the position and the fourth straight frame segment.

* * * * *

UNITED STATES PATENT AND TRADEMARK OFFICE
CERTIFICATE OF CORRECTION

PATENT NO. : 9,103,025 B2
APPLICATION NO. : 11/859138
DATED : August 11, 2015
INVENTOR(S) : Katsumi Iyanagi et al.

Page 1 of 1

It is certified that error appears in the above-identified patent and that said Letters Patent is hereby corrected as shown below:

In the claims,

Claim 1, column 10, line 6, please add -- ; -- between "magnet" and "a second"

Claim 1, column 10, line 10, please add -- ; -- between "magnet" and "a third"

Claim 1, column 10, line 13, please add -- ; -- between "magnet" and "and a fourth"

Claim 6, column 10, line 57, please replace "thereof center as well" with -- thereof as well --

Signed and Sealed this
Ninth Day of February, 2016

Michelle K. Lee
*Director of the United States Patent and Trademark Office*